US 11,894,839 B2

(12) United States Patent
Masuda et al.

(10) Patent No.: US 11,894,839 B2
(45) Date of Patent: Feb. 6, 2024

(54) BIDIRECTIONAL SWITCH CIRCUIT AND POWER CONVERSION DEVICE

(71) Applicant: Mitsubishi Electric Corporation, Tokyo (JP)

(72) Inventors: Koichi Masuda, Tokyo (JP); Mituharu Tabata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 17 days.

(21) Appl. No.: 17/703,908

(22) Filed: Mar. 24, 2022

(65) Prior Publication Data

US 2023/0090703 A1 Mar. 23, 2023

(30) Foreign Application Priority Data

Sep. 17, 2021 (JP) .................................. 2021-151950

(51) Int. Cl.
*H03K 17/687* (2006.01)
*H03K 17/567* (2006.01)
(Continued)

(52) U.S. Cl.
CPC ......... *H03K 17/6871* (2013.01); *H01L 24/48* (2013.01); *H01L 25/072* (2013.01);
(Continued)

(58) Field of Classification Search
CPC .............. H03K 17/6871; H03K 17/567; H01L 2924/1033
See application file for complete search history.

(56) References Cited

U.S. PATENT DOCUMENTS

2009/0058500 A1 3/2009 Osawa et al.
2016/0182032 A1* 6/2016 Goto .................... H03K 17/107
327/436

(Continued)

FOREIGN PATENT DOCUMENTS

DE 10 2020 114 480 A1 12/2020
JP 2008-166461 A 7/2008

OTHER PUBLICATIONS

An Office Action issued by the German Patent and Trademark Office on Aug. 30, 2023, which corresponds to German Patent Application No. 102022111582.8 and is related to U.S. Appl. No. 17/703,908; with English language translation.

*Primary Examiner* — Metasebia T Retebo
(74) *Attorney, Agent, or Firm* — Studebaker & Brackett PC (57) ABSTRACT

According to the present disclosure, a bidirectional switch circuit includes a first semiconductor device including a first backside electrode electrically connected to a first pattern and a first upper surface electrode, a second semiconductor device including a second backside electrode electrically connected to a second pattern and a second upper surface electrode, a first diode including a first cathode electrode electrically connected to the first pattern and a first anode electrode, a second diode including a second cathode electrode electrically connected to the first pattern and a second anode electrode, first wiring electrically connecting the first upper surface electrode and the second anode electrode and second wiring electrically connecting the second upper surface electrode and the first anode electrode, wherein the first upper surface electrode, the second upper surface electrode, the first anode electrode and the second anode electrode are electrically connected to each other.

22 Claims, 7 Drawing Sheets

(51) Int. Cl.
　　　*H02M 7/797*　　　(2006.01)
　　　*H01L 25/07*　　　(2006.01)
　　　*H01L 25/18*　　　(2023.01)
　　　*H01L 23/00*　　　(2006.01)

(52) U.S. Cl.
　　　CPC ............ *H01L 25/18* (2013.01); *H02M 7/797* (2013.01); *H03K 17/567* (2013.01); *H01L 2224/48137* (2013.01); *H01L 2924/1033* (2013.01); *H01L 2924/10254* (2013.01); *H01L 2924/10272* (2013.01); *H01L 2924/1203* (2013.01); *H01L 2924/13055* (2013.01); *H01L 2924/13091* (2013.01)

(56)　　　　　　References Cited

U.S. PATENT DOCUMENTS

2020/0388613　A1　　12/2020　Tabata
2021/0125916　A1*　4/2021　Hirao ...................... H01L 24/33

\* cited by examiner

BIDIRECTIONAL SWITCH CIRCUIT AND POWER CONVERSION DEVICE

BACKGROUND OF THE INVENTION

Field

The present disclosure relates to a bidirectional switch circuit and a power conversion device.

Background

JP 2008-166461 A discloses a bidirectional switch module. In the bidirectional switch module, a first semiconductor device having a junction electrode that is connected to a first nodal point of a bidirectional switch circuit is placed on a first metal base plate to be a thermal diffusion plate. Further, a second semiconductor device having a junction electrode that is connected to a second nodal point of the bidirectional switch circuit is placed on a second metal base plate to be similarly a heat diffusion plate. The junction electrode of the first semiconductor device has the same potential as the first metal base plate. Further, the junction electrode of the second semiconductor device has the same potential as the second metal base plate. The respective metal base plates and non-junction electrodes of the respective semiconductor devices are connected by fine metal wires to configure the bidirectional switch circuit.

In the bidirectional switch circuit of JP 2008-166461 A, a pattern of an emitter potential is arranged to make common emitter type circuit connection. Therefore, there is the fear that the area of the circuit becomes large.

SUMMARY

The present disclosure is made to solve the aforementioned problem, and has an object to obtain a bidirectional switch circuit and a power conversion device that can be miniaturized.

The features and advantages of the present disclosure may be summarized as follows.

According to an aspect of the present disclosure, a bidirectional switch circuit includes a first pattern, a second pattern, a first semiconductor device including a first gate electrode, a first backside electrode, and a first upper surface electrode provided on an opposite side to the first backside electrode, in which the first backside electrode is provided on the first pattern and is electrically connected to the first pattern, a second semiconductor device including a second gate electrode, a second backside electrode, and a second upper surface electrode provided on an opposite side to the second backside electrode, in which the second backside electrode is provided on the second pattern and is electrically connected to the second pattern, a first diode including a first cathode electrode, and a first anode electrode provided on an opposite side to the first cathode electrode, in which the first cathode electrode is provided on the first pattern and is electrically connected to the first pattern, a second diode including a second cathode electrode, and a second anode electrode provided on an opposite side to the second cathode electrode, in which the second cathode electrode is provided on the second pattern and is electrically connected to the second pattern, first wiring electrically connecting the first upper surface electrode and the second anode electrode and second wiring electrically connecting the second upper surface electrode and the first anode electrode, wherein the first upper surface electrode, the second upper surface electrode, the first anode electrode and the second anode electrode are electrically connected to each other.

Other and further objects, features and advantages of the disclosure will appear more fully from the following description.

DESCRIPTION OF EMBODIMENTS

A bidirectional switch circuit and a power conversion device according to embodiments of the present disclosure will be described with reference to the accompanying drawings. Components identical or corresponding to each other are indicated by the same reference characters, and repeated description of them is avoided in some cases.

First Embodiment

Figure 1:
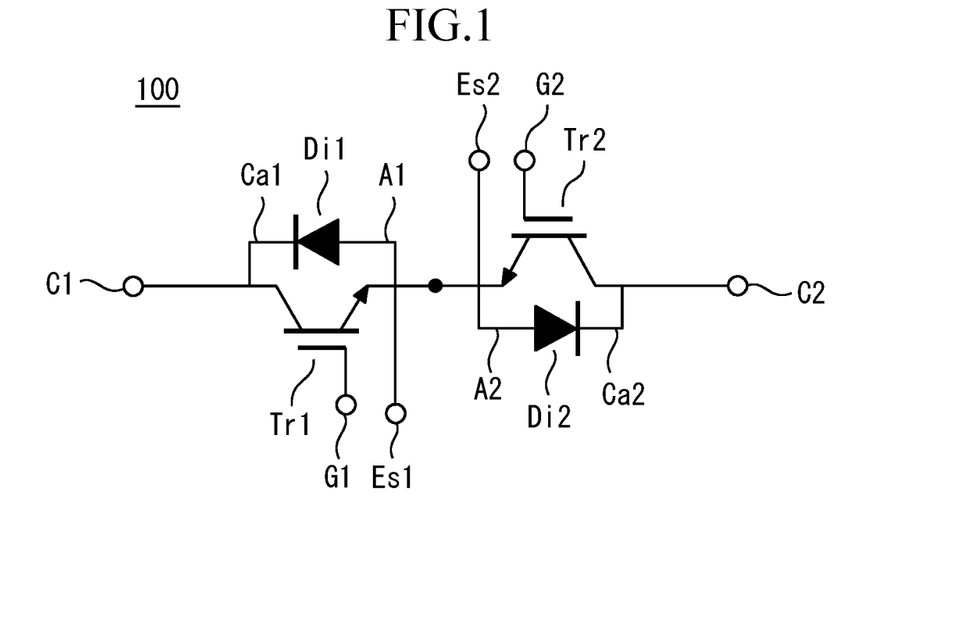
FIG. 1 is a diagram explaining a bidirectional switch circuit according to a first embodiment.
Figure 2:
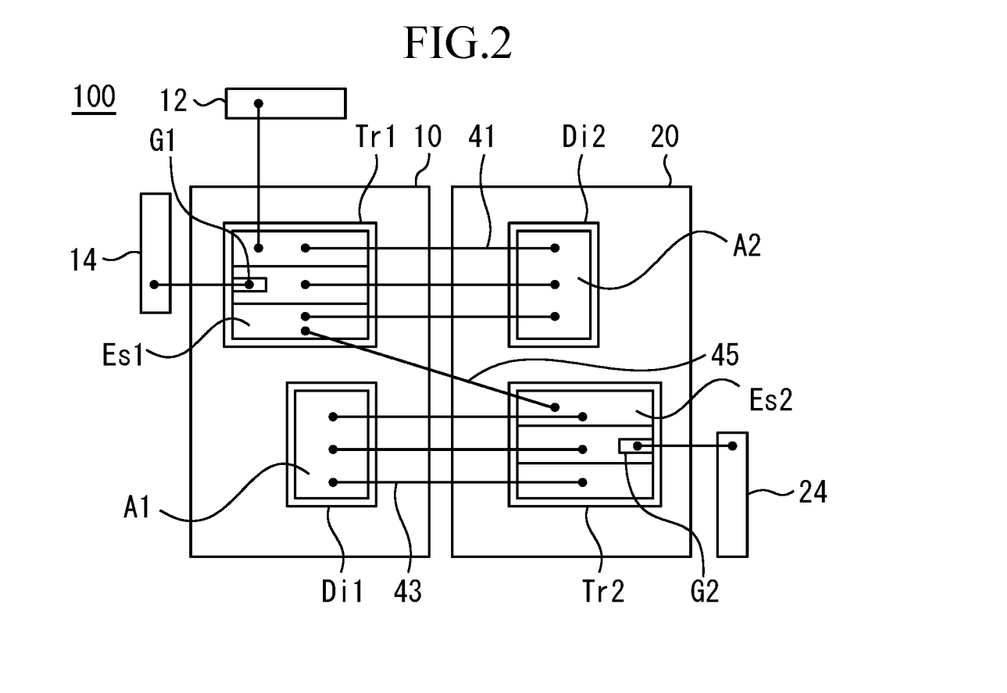
FIG. 2 is a plan view of the bidirectional switch circuit according to the first embodiment.

FIG. 1 is a diagram explaining a bidirectional switch circuit 100 according to a first embodiment. FIG. 2 is a plan view of the bidirectional switch circuit 100 according to the first embodiment. The bidirectional switch circuit 100 includes semiconductor devices Tr1 and Tr2, and diodes Di1 and Di2. The semiconductor devices Tr1 and Tr2 are IGBTs. The diode Di1 is connected to the semiconductor device Tr1 in antiparallel so that an anode and an emitter of the semiconductor device Tr1 have a same potential. Likewise, the diode Di2 is connected to the semiconductor device Tr2 in antiparallel so that an anode and an emitter of the semiconductor device Tr2 have a same potential.

The bidirectional switch circuit 100 includes patterns 10 and 20 arranged on insulating substrates. The patterns 10 and 20 are collector patterns. The semiconductor device Tr1 has a gate electrode G1, a backside electrode C1, and an upper surface electrode Es1 that is provided on an opposite side to the backside electrode C1. The backside electrode C1 is provided on the pattern 10, and is electrically connected to the pattern 10. The backside electrode C1 is a collector electrode, and the upper surface electrode Es1 is an emitter electrode.

The semiconductor device Tr2 has a gate electrode G2, a backside electrode C2, and an upper surface electrode Es2 provided on an opposite side to the backside electrode C2. The backside electrode C2 is provided on the pattern 20, and is electrically connected to the pattern 20. The backside electrode C2 is a collector electrode, and the upper surface electrode Es2 is an emitter electrode.

The diode Di1 has a cathode electrode Ca1, an anode electrode A1 that is provided on an opposite side to the cathode electrode Ca1. The cathode electrode Ca1 is provided on the pattern 10, and is electrically connected to the pattern 10. The diode Di2 has a cathode electrode Ca2, and an anode electrode A2 that is provided on an opposite side to the cathode electrode Ca2. The cathode electrode Ca2 is provided on the pattern 20, and is electrically connected to the pattern 20.

Wiring 41 electrically connects the upper surface electrode Es1 and the anode electrode A2. Wiring 43 electrically connects the upper surface electrode Es2 and the anode electrode A1. Further, the upper surface electrode Es1 and the upper surface electrode Es2 are electrically connected to each other by wiring 45 that is a connection section. The wiring 41, 43 and 45 are fine metal wires such as aluminum wires, for example. By the above connection, the emitter electrode and the anode electrode of each chip have a same potential.

An emitter drive pattern 12 is electrically connected to the upper surface electrode Es1 via wiring. Gate patterns 14 and 24 are respectively electrically connected to the gate electrodes G1 and G2 via wiring.

Further, the patterns 10 and 20 are each electrically connected to a terminal not illustrated for connecting to an outside of the module. In the bidirectional switch circuit 100, it is possible to pass a current from both directions across the patterns 10 and 20 via the semiconductor device Tr1 and the diode Di2 or the semiconductor device Tr2 and the diode Di1.

Figure 3:
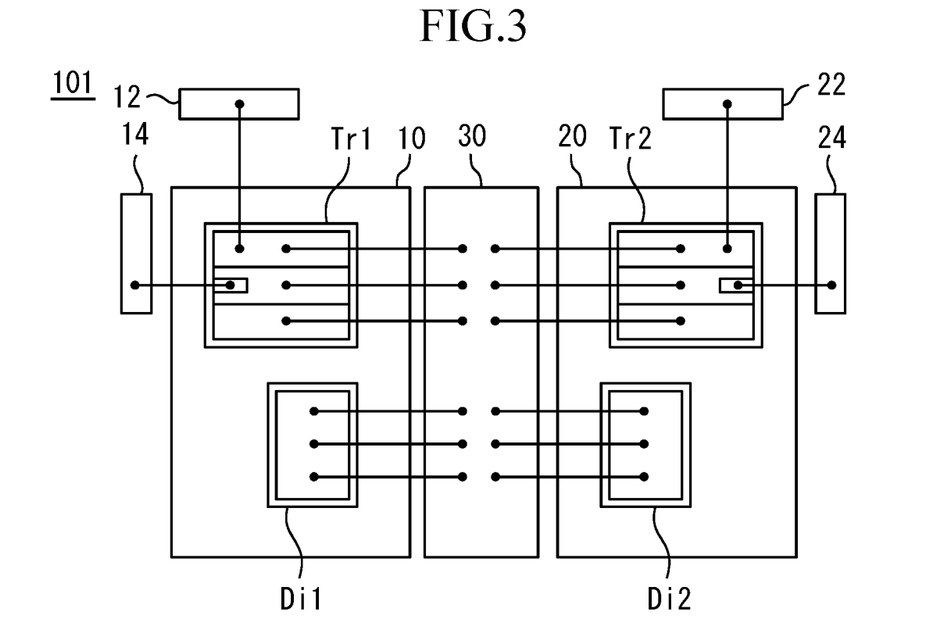
FIG. 3 is a plan view of a bidirectional switch circuit according to a comparative example.

FIG. 3 is a plan view of a bidirectional switch circuit 101 according to a comparative example. In the bidirectional switch circuit 101 according to the comparative example, an emitter pattern 30 is provided to cause emitter electrodes and anode electrodes of a plurality of chips to have a same potential. Furthermore, emitter drive patterns 12 and 22 are respectively provided in semiconductor devices Tr1 and Tr2. Accordingly, there is the fear that an area of the circuit becomes large.

In contrast to this, in the bidirectional switch circuit 100 according to the present embodiment, the emitter electrodes of the semiconductor devices Tr1 and Tr2, and the anode electrodes of the diodes Di1 and Di2 can be caused to have the same potential by the wiring 41, 43 and 45. Accordingly, the emitter pattern can be omitted, and the circuit can be miniaturized. Furthermore, since the emitter drive pattern 12 of the semiconductor devices Tr1 and Tr2 can be shared, the circuit area can be further reduced.

Further, normal IGBTs do not have withstand voltage against reverse voltage. In contrast to this, in the present embodiment, it is possible to connect the IGBT and diode in antiparallel. The antiparallel connection can prevent a voltage equal to or higher than a forward voltage VF of the diode from being applied to the IGBT. Accordingly, it is possible to suppress a reverse withstand voltage breakdown in the IGBT.

Figure 4:
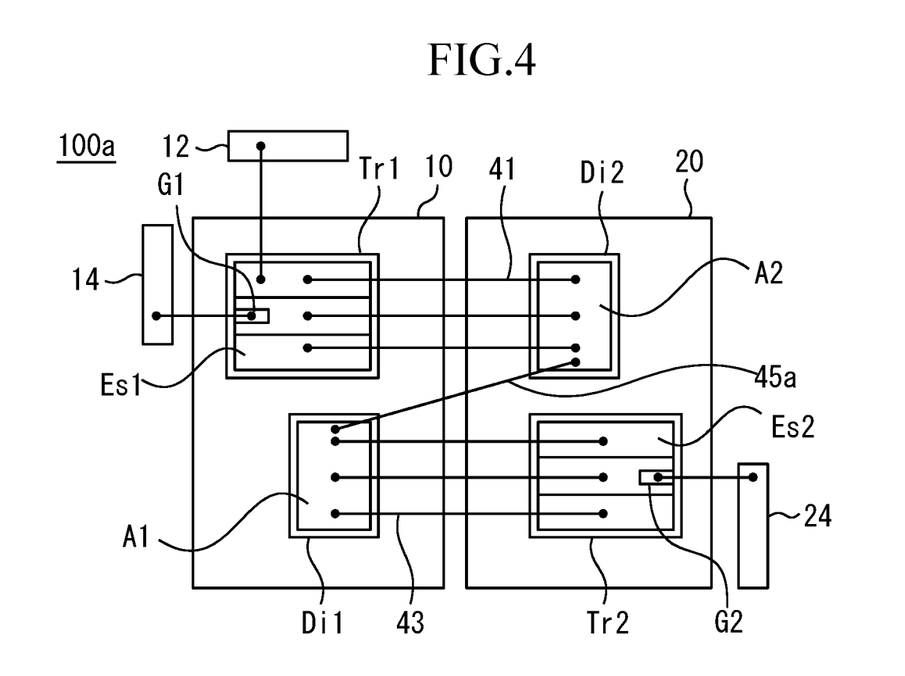
FIG. 4 is a plan view of a bidirectional switch circuit according to a first modified example of the first embodiment.
Figure 5:
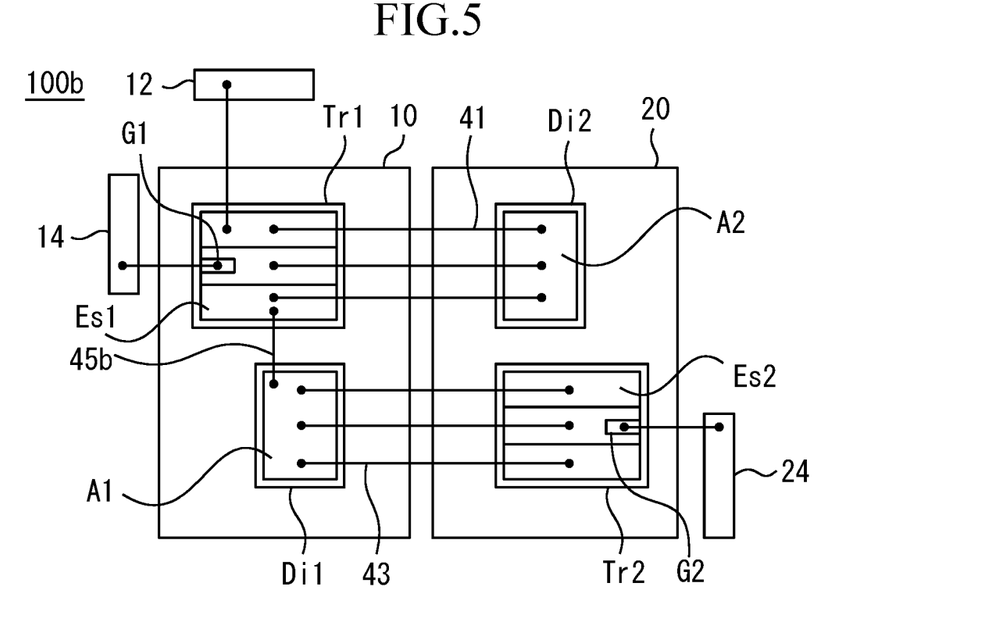
FIG. 5 is a plan view of a bidirectional switch circuit according to a second modified example of the first embodiment.
Figure 6:
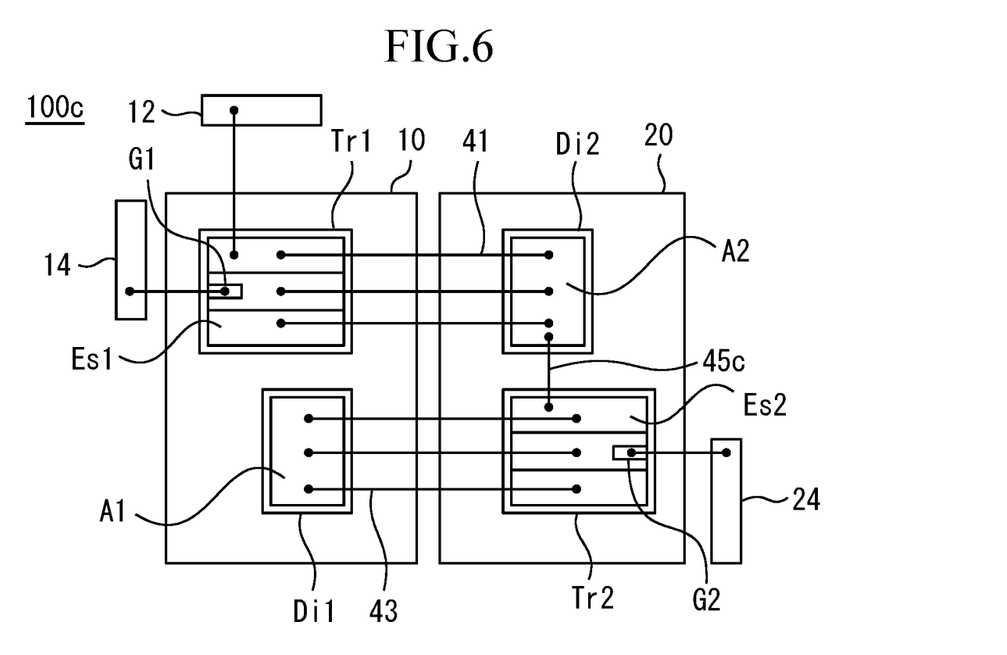
FIG. 6 is a plan view of a bidirectional switch circuit according to a third modified example of the first embodiment.

As a modified example of the present embodiment, a connection position of the wiring 45 is not limited to the position illustrated in FIG. 2, as long as the upper surface electrode Es1, the upper surface electrode Es2, the anode electrode A1 and the anode electrode A2 are electrically connected to each other. For example, short circuit methods as shown in FIGS. 4 to 6 are also possible. FIG. 4 is a plan view of a bidirectional switch circuit 100a according to a first modified example of the first embodiment. In this way, an anode electrode A1 and an anode electrode A2 may be electrically connected by wiring 45a. FIG. 5 is a plan view of a bidirectional switch circuit 100b according to a second modified example of the first embodiment. In this way, an upper surface electrode Es1 and an anode electrode A1 may be electrically connected by wiring 45b. FIG. 6 is a plan view of a bidirectional switch circuit 100c according to a third modified example of the first embodiment. In this way, an upper surface electrode Es2 and an anode electrode A2 may be electrically connected by wiring 45c.

In the present embodiment, the semiconductor devices Tr1 and Tr2 are IGBTs. The semiconductor devices Tr1 and Tr2 may be switching elements such as MOSFETs (Metal-Oxide-Semiconductor Field-Effect Transistors).

Further, the fine metal wire that is used as the wiring 41, 43 and 45 is formed of a copper, Al alloy or a copper-clad Al, for example. This can reduce heat generation due to a current flowing through the fine metal wire. Accordingly, a current density per wire can be increased and the number of wires can be reduced. Further, when the number of wires is not reduced, reduction in temperature of the fine metal wire and extension of life of the device can be expected. The fine metal wire like this may be adopted in part of a member that connects the upper surface electrode Es1, the upper surface electrode Es2, the anode electrode A1 and the anode electrode A2 to each other.

The member that connects the upper surface electrode Es1, the upper surface electrode Es2, the anode electrode A1 and the anode electrode A2 to each other may include a metal plate. The metal plate is of, for example, a lead frame material or a ribbon material. Thereby, reduction in temperature of the connection member and extension of the life of the device can be expected. Further, wiring can be simplified.

At least one of the semiconductor devices Tr1 and Tr2 and the diodes Di1 and Di2 may be made with a wide band gap semiconductor. The wide band gap semiconductor is a silicon carbide, gallium-nitride-based material or diamond, for example. This can reduce a loss in the bidirectional switch circuit 100.

These modifications can be appropriately applied to bidirectional switch circuits and power conversion devices according to embodiments below. Meanwhile, for the bidirectional switch circuits and the power conversion devices according to the embodiments below, dissimilarities with the first embodiment will mainly be explained as they have many similarities with the first embodiment.

Second Embodiment

Figure 7:
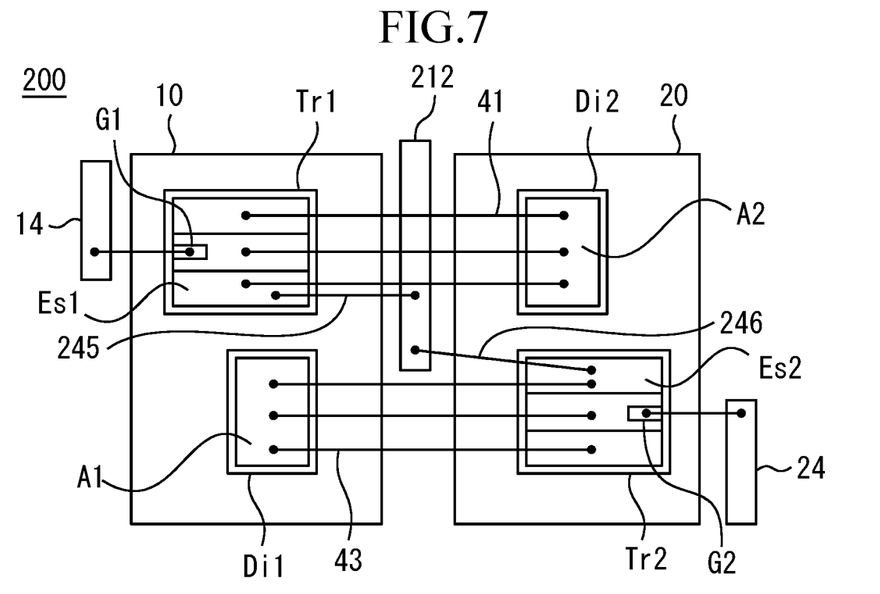
FIG. 7 is a plan view of a bidirectional switch circuit according to a second embodiment.

FIG. 7 is a plan view of a bidirectional switch circuit according to a second embodiment. The bidirectional switch circuit 200 of the present embodiment differs from the bidirectional switch circuit 100 in that upper surface electrodes Es1 and Es2 are connected via an emitter drive pattern 212. The other configurations are the same as the configurations of the bidirectional switch circuit 100. In the present embodiment, a connection section that connects the upper surface electrode Es1 and the upper surface electrode Es2 has wiring 245, the emitter drive pattern 212 and wiring 246. Connection like this causes an emitter electrode and an anode electrode of each chip to have a same potential.

The emitter drive pattern 212 is electrically connected to an emitter drive terminal that is not illustrated and connected to an outside of the bidirectional switch circuit 200 to input signals to semiconductor devices Tr1 and Tr2. In other words, the emitter drive pattern 212 is electrically connected to an input signal circuit that sends input signals to the semiconductor devices Tr1 and Tr2. This also applies to the emitter drive pattern 12 of the first embodiment. In other words, voltage is supplied to the upper surface electrode Es1 and the upper surface electrode Es2 from the outside via the emitter drive patterns 12 and 212.

In contrast to this, the emitter pattern 30 according to the comparative example illustrated in FIG. 3 is not electrically connected to any external terminal and is different from the emitter drive patterns 12 and 212.

In the comparative example illustrated in FIG. 3, the emitter drive patterns 12 and 22 are respectively provided in the semiconductor devices Tr1 and Tr2. In contrast to this, in the present embodiment, the semiconductor devices Tr1 and Tr2 share the emitter drive pattern 212. Furthermore, the upper surface electrodes Es1 and Es2 are connected via the emitter drive pattern 212. This makes it possible to miniaturize the bidirectional switch circuit 200 and reduce components thereof.

Further in the present embodiment, it is possible to improve a degree of freedom of circuit design by sharing the emitter drive pattern 212 of the semiconductor devices Tr1 and Tr2. Further, it is possible to decrease a difference in loss during switching operation of the semiconductor devices Tr1 and Tr2 by wiring the semiconductor devices Tr1 and Tr2 symmetrically with respect to the emitter drive pattern 212.

Figure 9:
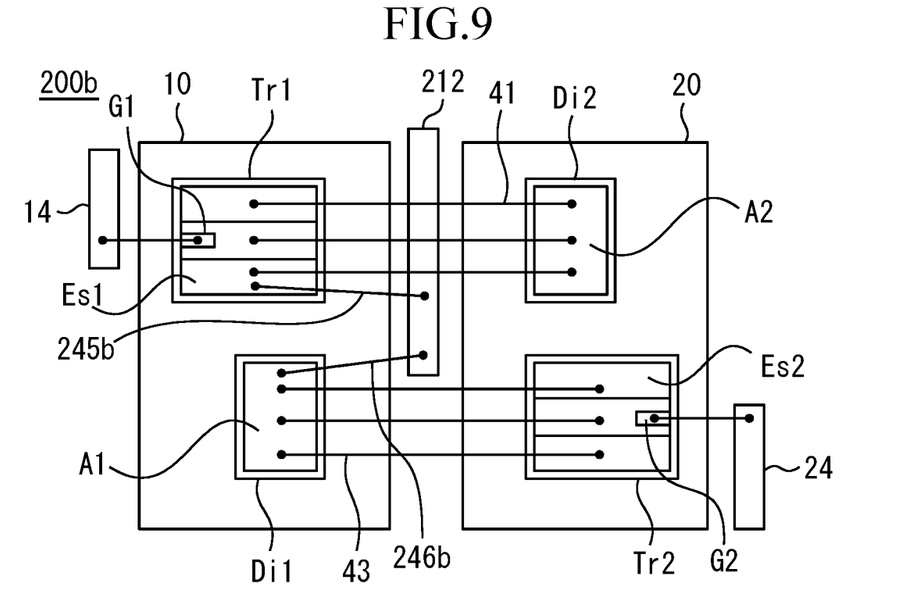
FIG. 9 is a plan view of a bidirectional switch circuit according to a second modified example of the second embodiment.
Figure 10:
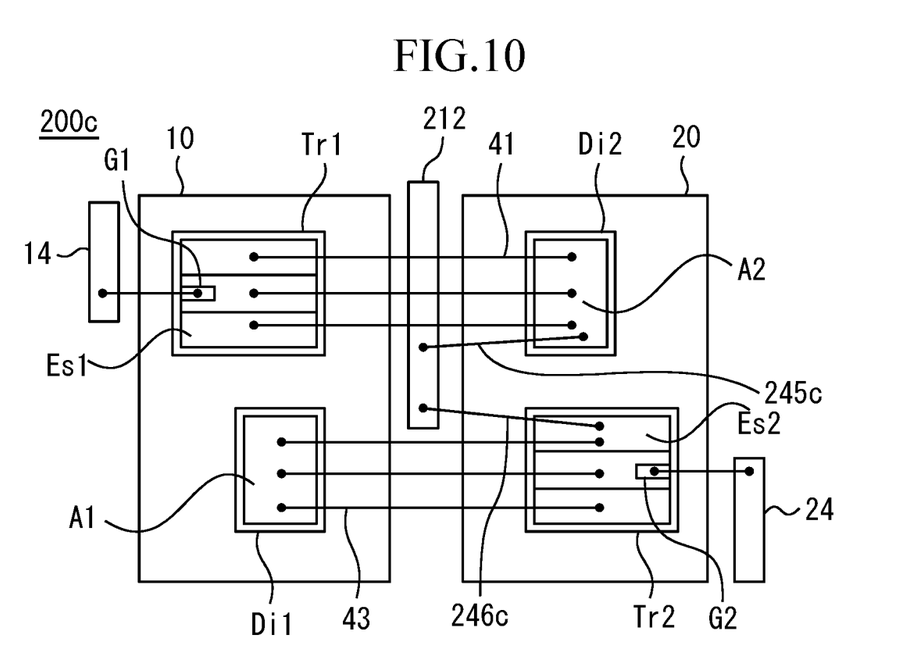
FIG. 10 is a plan view of a bidirectional switch circuit according to a third modified example of the second embodiment.

As a modified example of the present embodiment, a connection position of the emitter drive pattern 212 is not limited to the position illustrated in FIG. 7 as long as the upper surface electrode Es1, the upper surface electrode Es2, the anode electrode A1 and the anode electrode A2 are electrically connected to each other. For example, connection methods as illustrated in FIGS. 8 to 10 are also possible.

Figure 8:
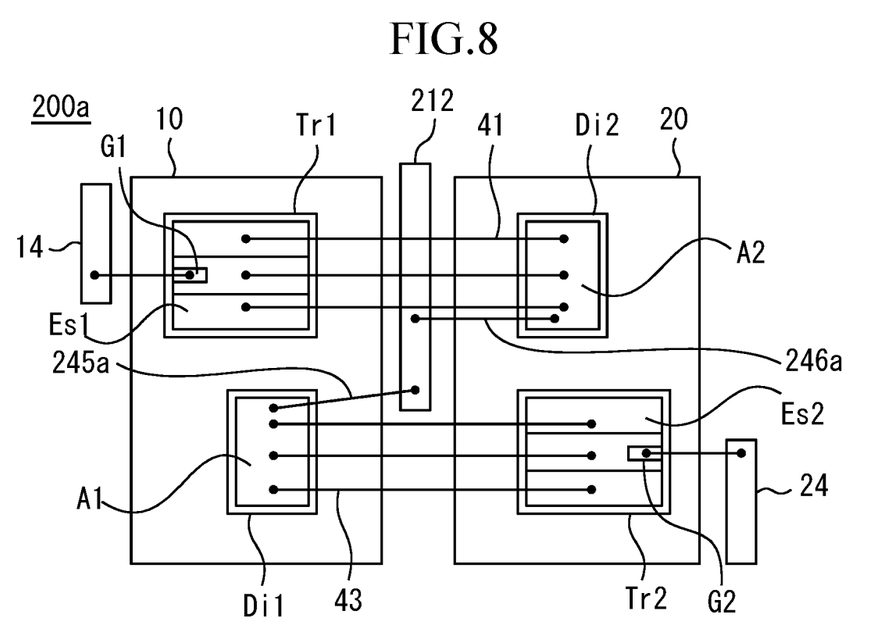
FIG. 8 is a plan view of a bidirectional switch circuit according to a first modified example of the second embodiment.

FIG. 8 is a plan view of a bidirectional switch circuit 200a according to a first modified example of the second embodiment. In the bidirectional switch circuit 200a, the anode electrode A1 and the anode electrode A2 are electrically connected via wiring 245a, an emitter drive pattern 212, and wiring 246a. FIG. 9 is a plan view of a bidirectional switch circuit 200b according to a second modified example of the second embodiment. In the bidirectional switch circuit 200b, an upper surface electrode Es1 and an anode electrode A1 are electrically connected via wiring 245b, an emitter drive pattern 212, and wiring 246b. FIG. 10 is a plan view of a bidirectional switch circuit 200c according to a third modified example of the second embodiment. In the bidirectional switch circuit 200c, an upper surface electrode Es2 and an anode electrode A2 are electrically connected via wiring 245c, an emitter drive pattern 212, and wiring 246c.

Third Embodiment

Figure 11:
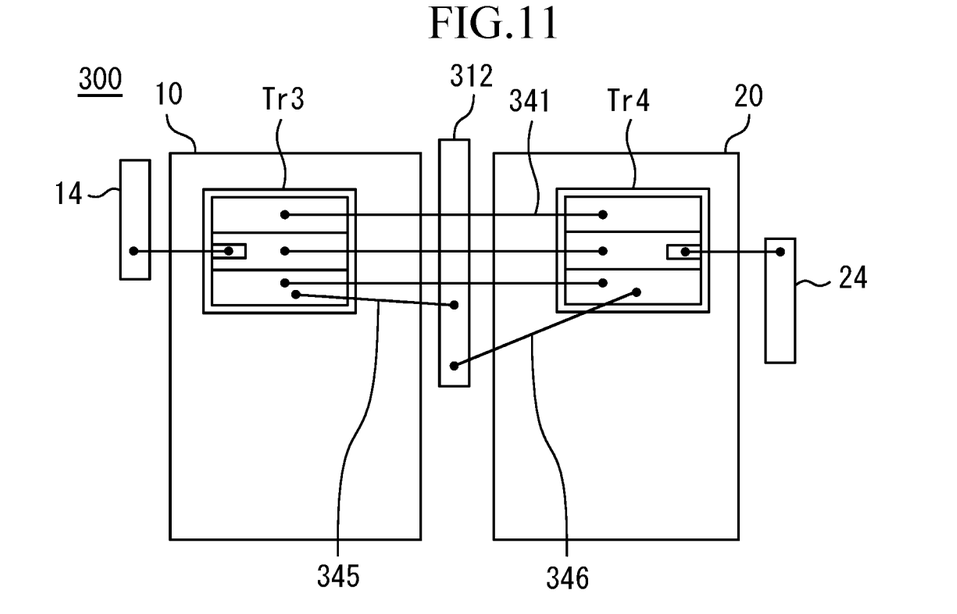
FIG. 11 is a plan view of a bidirectional switch circuit according to a third embodiment.

FIG. 11 is a plan view of a bidirectional switch circuit 300 according to a third embodiment. The present embodiment differs from the second embodiment in that a semiconductor device Tr1 and a diode Di1 are formed in one chip Tr3, and a semiconductor device Tr2 and a diode Di2 are formed in one chip Tr4. The other configurations are same as the configurations of the second embodiment. The semiconductor device Tr1 and the diode Di1 configure an RC (Reverse-Conducting)-IGBT. The semiconductor device Tr2 and the diode Di2 configure an RC-IGBT.

On a pattern 10, a collector electrode and a cathode electrode of the chip Tr3 that is an RC-IGBT are provided. On a pattern 20, a collector electrode and a cathode electrode of the chip Tr4 that is an RC-IGBT are provided. An emitter electrode of the chip Tr3 and an anode electrode of the chip Tr4 are electrically connected by wiring 341. An emitter electrode of the chip Tr4 and an anode electrode of the chip Tr3 are electrically connected by wiring 341. Furthermore, an emitter electrode of the chip Tr3 and an emitter electrode of the chip Tr4 are electrically connected via wiring 345, an emitter drive pattern 312, and wiring 346.

In the present embodiment, it is possible to further reduce a circuit area and the number of components by configuring the switching element and the diode as one chip.

Figure 12:
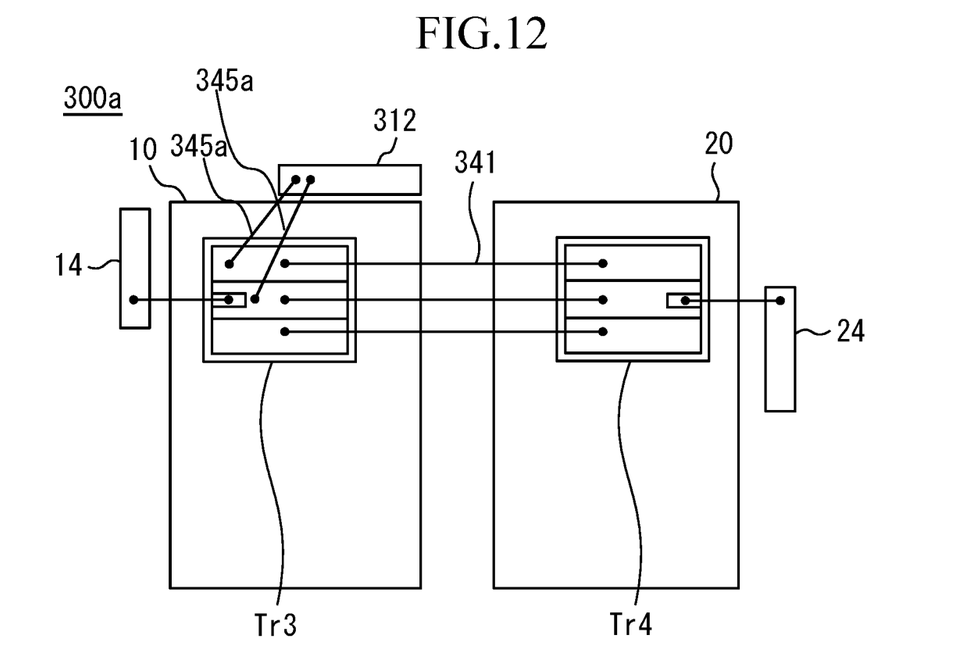
FIG. 12 is a plan view of a bidirectional switch circuit according to a second modified example of the third embodiment.
Figure 13:
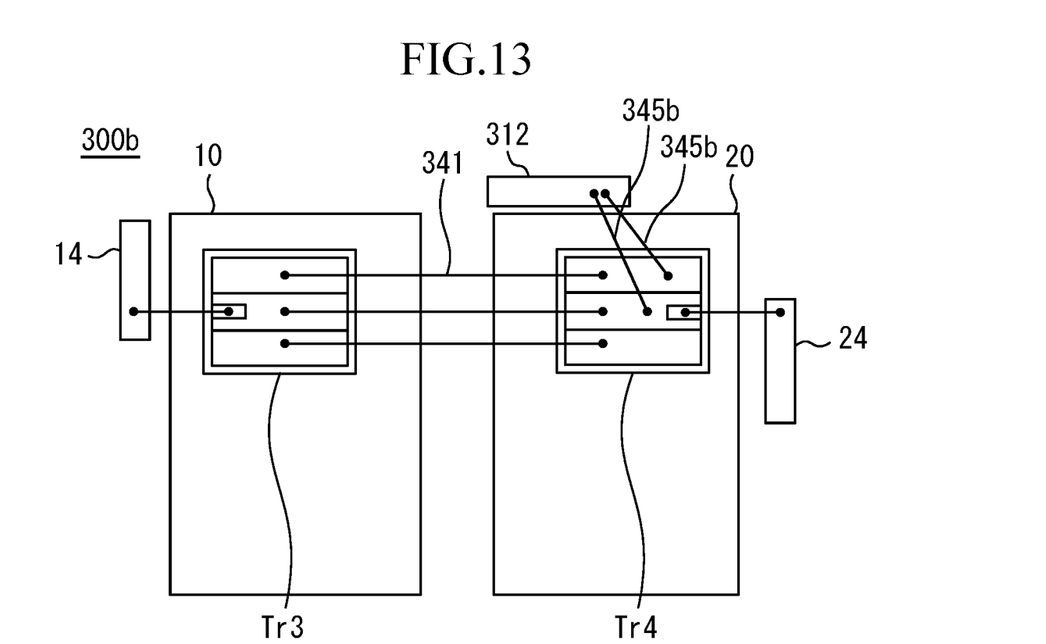
FIG. 13 is a plan view of a bidirectional switch circuit according to a third modified example of the third embodiment.

As a first modified example of the present embodiment, an anode electrode of a chip Tr3 and an anode electrode of a chip Tr4 may be electrically connected via wiring 345, an emitter drive pattern 312 and wiring 346. FIG. 12 is a plan view of a bidirectional switch circuit 300a according to a second modified example of the third embodiment. As in the bidirectional switch circuit 300a, an emitter electrode of a tip Tr3 and an anode electrode of the chip Tr3 may be electrically connected via wiring 345a and an emitter drive pattern 312. FIG. 13 is a plan view of a bidirectional switch circuit 300b according to a third modified example of the third embodiment. As in the bidirectional switch circuit 300b, an emitter electrode of a chip Tr4 and an anode electrode of the chip Tr4 may be electrically connected via wiring 345b and an emitter drive pattern 312.

Further, in the bidirectional switch circuit 300, the emitter electrode of the chip Tr3 and the emitter electrode of the chip Tr4 may be directly connected by the wiring 345 without going through the emitter drive pattern 312. Further, in the present embodiment, the examples of the RC-IGBT chip are shown, but the switching element and the diode may be formed in one MOSFET chip. In this case, the diodes Di1 and Di2 are formed as body diodes of the MOSFETs.

Fourth Embodiment

Figure 14:
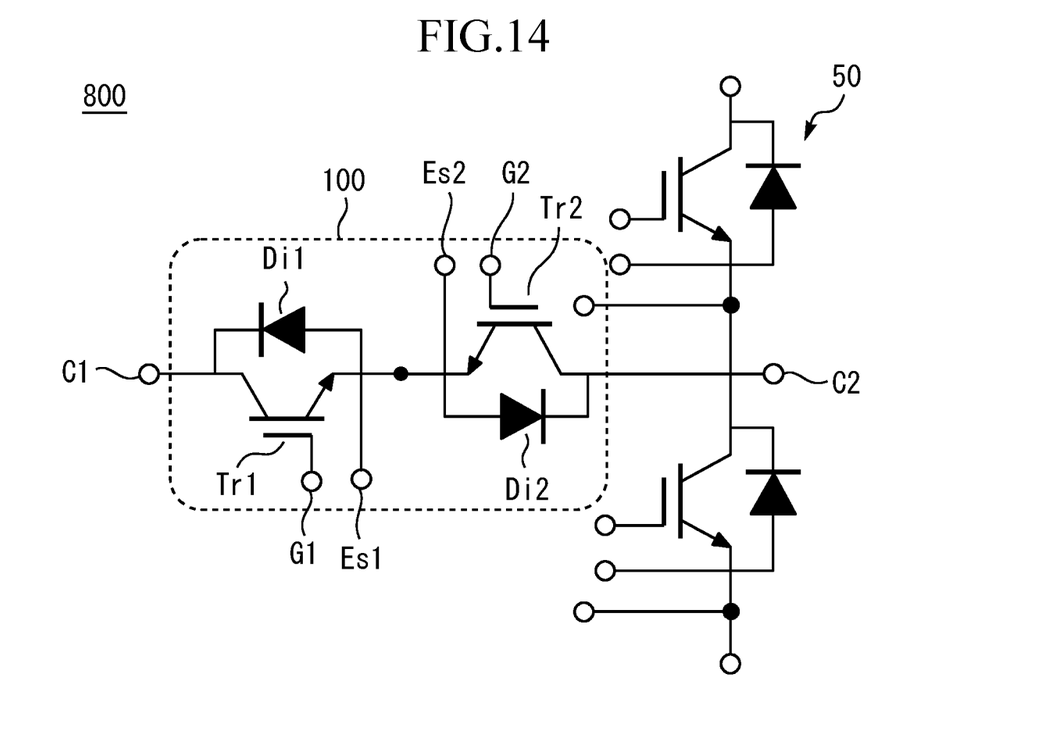
FIG. 14 is a view explaining a power conversion device according to a fourth embodiment.

FIG. 14 is a view explaining a power conversion device 800 according to a fourth embodiment. The power conversion device 800 includes the bidirectional switch circuit described in each of the first to third embodiments and an inverter circuit 50. FIG. 14 illustrates an example in which the power conversion device 800 includes the bidirectional switch circuit 100. The power conversion device 800 is, for example, a three-level inverter circuit. The power conversion device 800 may be a converter circuit. It becomes possible to miniaturize the power conversion device 800 and an application system thereof by using the bidirectional switch circuit 100.

Meanwhile, technical features explained in each embodiment may be appropriately combined to use.

In the bidirectional switch circuit according to the present disclosure, the first upper surface electrode and the second anode electrode are electrically connected by first wiring, and the second upper surface electrode and the first anode electrode are electrically connected by second wiring. Further, the first upper surface electrode, the second upper surface electrode, the first anode electrode and the second anode electrode are electrically connected to each other. Consequently, it is not necessary to add a pattern of an emitter potential, and miniaturization becomes possible.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-151950, filed on Sep. 17, 2021 including specification, claims, drawings and summary, on which the Convention priority of the present application is based, are incorporated herein by reference in its entirety.

The invention claimed is:

1. A bidirectional switch circuit, comprising:
a first pattern;
a second pattern;
a first semiconductor device including a first gate electrode, a first backside electrode, and a first upper surface electrode provided on an opposite side to the first backside electrode, in which the first backside electrode is provided on the first pattern and is electrically connected to the first pattern;
a second semiconductor device including a second gate electrode, a second backside electrode, and a second upper surface electrode provided on an opposite side to the second backside electrode, in which the second backside electrode is provided on the second pattern and is electrically connected to the second pattern;
a first diode including a first cathode electrode, and a first anode electrode provided on an opposite side to the first cathode electrode, in which the first cathode electrode is provided on the first pattern and is electrically connected to the first pattern;
a second diode including a second cathode electrode, and a second anode electrode provided on an opposite side to the second cathode electrode, in which the second cathode electrode is provided on the second pattern and is electrically connected to the second pattern;
a first wiring arrangement including a plurality of first wirings electrically connecting the first upper surface electrode and the second anode electrode; and
a second wiring arrangement including a plurality of second wirings electrically connecting the second upper surface electrode and the first anode electrode,
wherein the first upper surface electrode, the second upper surface electrode, the first anode electrode and the second anode electrode are electrically connected to each other.

2. The bidirectional switch circuit according to claim 1, wherein the first upper surface electrode and the second upper surface electrode are electrically connected by a connection section.

3. The bidirectional switch circuit according to claim 1, wherein the first anode electrode and the second anode electrode are electrically connected by a connection section.

4. The bidirectional switch circuit according to claim 1, wherein the first upper surface electrode and the first anode electrode are electrically connected by a connection section.

5. The bidirectional switch circuit according to claim 1, wherein the second upper surface electrode and the second anode electrode are electrically connected by a connection section.

6. The bidirectional switch circuit according to claim 2, wherein the connection section is third wiring.

7. The bidirectional switch circuit according to claim 2, wherein the connection section includes a drive pattern, and
a voltage is supplied to the first upper surface electrode and the second upper surface electrode from an outside via the drive pattern.

8. The bidirectional switch circuit according to claim 1, wherein the first semiconductor device and the first diode are formed in one chip.

9. The bidirectional switch circuit according to claim 1, wherein the first semiconductor device and the second semiconductor device are IGBTs.

10. The bidirectional switch circuit according to claim 1, wherein the first semiconductor device and the second semiconductor device are MOSFETs.

11. The bidirectional switch circuit according to claim 1, wherein a member that connects the first upper surface electrode, the second upper surface electrode, the first anode electrode and the second anode electrode to each other includes a fine metal wire.

12. The bidirectional switch circuit according to claim 11, wherein the fine metal wire is formed from a copper, an Al alloy or a copper-clad Al.

13. The bidirectional switch circuit according to claim 1, wherein a member that connects the first upper surface electrode, the second upper surface electrode, the first anode electrode and the second anode electrode to each other includes a metal plate.

14. The bidirectional switch circuit according to claim 1, wherein the first semiconductor device, the second semiconductor device, the first diode or the second diode is made with a wide band gap semiconductor.

15. The bidirectional switch circuit according to claim 14, wherein the wide band gap semiconductor is silicon carbide, gallium-nitride-based material or diamond.

16. A power conversion device, comprising the bidirectional switch circuit according to claim 1.

17. The bidirectional switch circuit according to claim 3, wherein the connection section is third wiring.

18. The bidirectional switch circuit according to claim 4, wherein the connection section is third wiring.

19. The bidirectional switch circuit according to claim 5, wherein the connection section is third wiring.

20. The bidirectional switch circuit according to claim 3, wherein the connection section includes a drive pattern, and
a voltage is supplied to the first upper surface electrode and the second upper surface electrode from an outside via the drive pattern.

21. The bidirectional switch circuit according to claim 4, wherein the connection section includes a drive pattern, and
a voltage is supplied to the first upper surface electrode and the second upper surface electrode from an outside via the drive pattern.

22. The bidirectional switch circuit according to claim 5, wherein the connection section includes a drive pattern, and
a voltage is supplied to the first upper surface electrode and the second upper surface electrode from an outside via the drive pattern.

* * * * *